(12) United States Patent
Andres

(10) Patent No.: US 9,274,141 B1
(45) Date of Patent: Mar. 1, 2016

(54) LOW RESISTANCE LOW WEAR TEST PIN FOR TEST CONTACTOR

(71) Applicant: JohnsTech International Corporation, Minneapolis, MN (US)

(72) Inventor: Michael Andres, Inver Grove Heights, MN (US)

(73) Assignee: Johnstech International Corporation, Minneapolis, MN (US)

(*) Notice: Subject to any disclaimer, the term of this patent is extended or adjusted under 35 U.S.C. 154(b) by 392 days.

(21) Appl. No.: 13/746,607

(22) Filed: Jan. 22, 2013

(51) Int. Cl.
*G01R 1/067* (2006.01)
*H05K 3/00* (2006.01)

(52) U.S. Cl.
CPC .............. *G01R 1/06738* (2013.01); *H05K 3/00* (2013.01)

(58) Field of Classification Search
USPC ............. 324/756.02, 755.01, 756.05, 750.16, 324/754.01, 756.01, 750.25, 754.11, 324/762.01, 762.02, 537, 754.03, 754.08, 324/756.07, 149, 750.19, 750.3, 754.05, 324/763.01, 750.24; 439/632, 630, 700, 71, 439/824, 482, 874, 66, 91, 169, 219, 72, 439/70; 257/690; 333/247, 260; 29/874, 29/884
See application file for complete search history.

(56) References Cited

U.S. PATENT DOCUMENTS

| | | | |
|---|---|---|---|
| 4,321,122 A | 3/1982 | Whitcomb et al. | |
| 5,207,584 A | 5/1993 | Johnson | |
| 5,594,355 A | 1/1997 | Ludwig | |
| 5,634,801 A | 6/1997 | Johnson | |
| 5,781,022 A | 7/1998 | Wood et al. | |
| 5,816,828 A | 10/1998 | Ikeya et al. | |
| 5,947,749 A * | 9/1999 | Rathburn | H01R 13/2435 439/66 |
| 6,152,744 A | 11/2000 | Maeda | |
| 7,639,026 B2 * | 12/2009 | Shell et al. | 324/754.03 |
| 7,914,295 B2 * | 3/2011 | Nakamura et al. | 439/66 |
| 8,952,714 B2 | 2/2015 | Foong et al. | |
| 2002/0045365 A1 | 4/2002 | Lee | |
| 2004/0217771 A1 | 11/2004 | Leong | |
| 2004/0248448 A1 | 12/2004 | Gilk | |
| 2007/0032128 A1 * | 2/2007 | Lopez et al. | 439/525 |
| 2008/0006103 A1 * | 1/2008 | Sherry | 73/866.5 |
| 2008/0054924 A1 | 3/2008 | Foong | |
| 2009/0267629 A1 | 10/2009 | Foong | |
| 2010/0264935 A1 * | 10/2010 | Erdman et al. | 324/537 |
| 2012/0062261 A1 * | 3/2012 | Nelson | G01R 1/06738 324/755.09 |

FOREIGN PATENT DOCUMENTS

EP 1826575 8/2007
WO WO2012/165936 12/2012

* cited by examiner

*Primary Examiner* — Melissa Koval
*Assistant Examiner* — Nasima Monsur
(74) *Attorney, Agent, or Firm* — Altera Law Group, LLC

(57) ABSTRACT

A contact for use in a test set which can be mounted to a load board of a tester apparatus. The contact, which serves to electrically connect at least one lead of a device being tested with a corresponding metallic trace on the load board, has a first end defining multiple contact points. As the test pin is rotated about an axis generally perpendicular to a plane defined by the contact, successive contact points are sequentially engaged by a lead of the device being tested. The test pin has a hard stop edge which engages a hard stop wall which limits its rotation movement. The bottom of the pin has a shallow convex curvature preferably with a flat region and the tip of the test pin has a chisel edge.

15 Claims, 8 Drawing Sheets

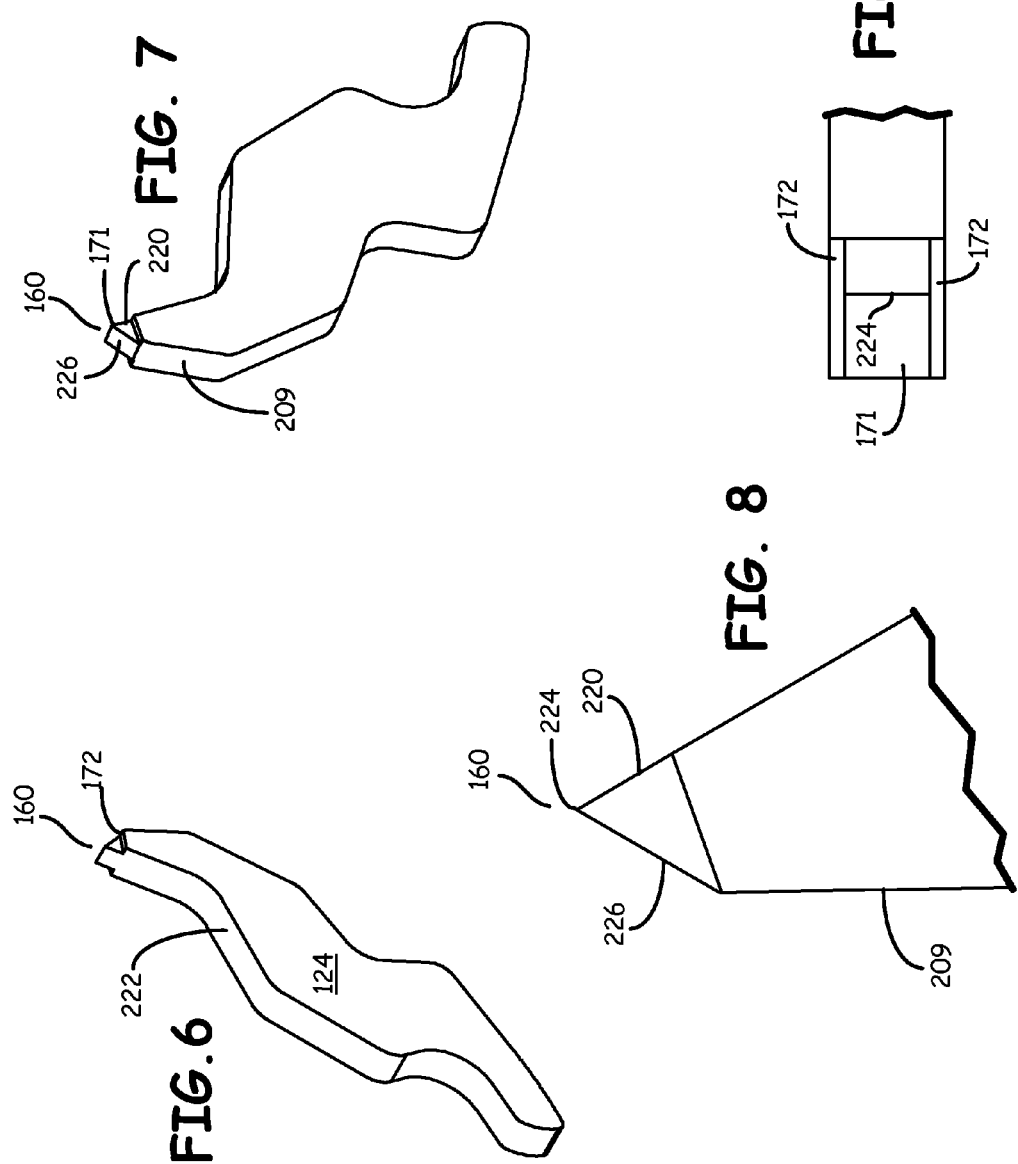

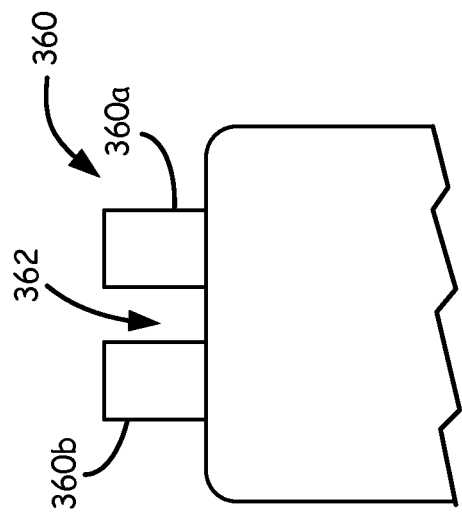
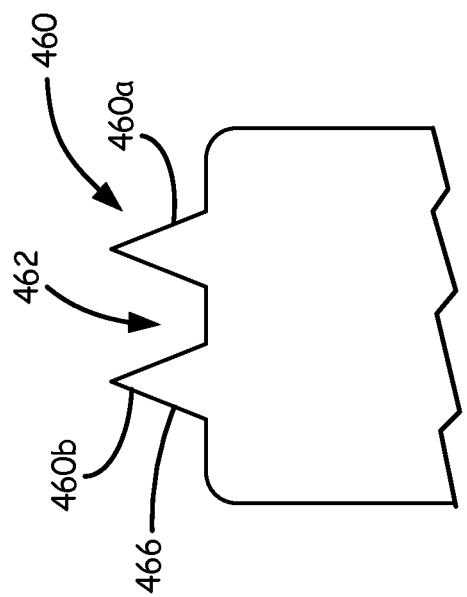

LOW RESISTANCE LOW WEAR TEST PIN FOR TEST CONTACTOR

TECHNICAL FIELD

The present disclosure relates broadly to the field of testing of electronic devices such as integrated circuits. More narrowly, however, the disclosure deals with test contacts for interfacing pads or leads of a device to be tested with corresponding pads of a circuit board of a test apparatus. In addition, improvements in the contact tip and shape of the pin as a whole are disclosed.

BACKGROUND

U.S. Pat. No. 7,639,026, and its priority document, to Shell et al issued 29 Dec. 2009 is hereby incorporated by reference in its entirety and provide background to this invention.

The testing of integrated circuit devices is performed to ensure that such devices, when sold to a customer, are of as high a degree of quality as possible. Various types of test apparatus have been utilized over the years to accomplish testing. Typically, a tester includes a printed circuit board which has defined thereon a plurality of conductive traces. These traces on the circuit board, or load board, are associated with corresponding functions of the test apparatus.

In order to accomplish testing, it is necessary to interconnect a lead, in the case of a leaded device under test, or a pad, of a nonleaded device under test, to a corresponding trace on the load board. A test set or test socket having a plurality of contacts is interposed between the device under test and the load board in order to effectuate interconnection. A contact is engaged, at an upper end thereof, by the lead or pad of the DUT, depending upon the type of DUT being tested, with its corresponding trace on the load board. A lower end of the contact is in engagement with a trace on the load board.

As technology has progressed, the size, shape and electronic properties of contacts have evolved in response to the construction of test sets and load boards and the architecture of devices to be tested. At one time, it was considered necessary to have a wiping action at the various locations of engagement of the contact ends by the lead or pad of the DUT and the pad on the load board.

Such wiping action was deemed to facilitate a good transmission path through the contact because of a good connection at either end thereof. It has become more apparent, however, that the measure of wiping action formerly considered necessary to maintain a good transmission path need not be of a degree as was formerly believed. Further, it has been recognized that excessive wiping action can damage component parts at the various points of engagement of the contact, and thereby significantly decrease the life of the test socket and tester load board. Consequently, various attempts have been made to minimize abrading of one surface relative to another. Various elastomeric mounting means have been devised in an effort to minimize abrasion and consequent deterioration of components.

Another problem which has been discovered is the diminishment of effectiveness of testing as a result of the employment of matte tin on leads and pads of various types of DUTs. Such a material is applied to DUT components which facilitate soldering to an ultimate host circuit board. Because of its softness, however, it easily can progressively become adhered to the contact which the DUT engages as rubbing across engaged surfaces occurs during the testing function. Eventually, matte tin can build up to the point where signal integrity through the contact can become diminished.

In addition, it has been determined, that the tip of prior art contacts has drawbacks. First, wiping action of such tips may cause it to miss its target contact point through all or part of its rocking action. Second, the rocking action may cause significant wear on the contact tip. Third, the wiping action can release debris which is electrically conductive and thus result in test failure, either from shorting across contacts, or by changing the high frequency response of the text fixture due to build up of metallic debris.

It is to these dictates and shortcomings of the prior art that the present disclosure is directed. The present invention is a contact having a structure which minimizes tin buildup on the contact.

SUMMARY

The present disclosure is a contact for use in a test set mountable to a load board of a tester apparatus. The contact serves to electrically connect at least one lead of a device to be tested (DUT) with a corresponding metallic trace on the load board. The contact has a first end which defines multiple contact points engageable by the lead of the DUT. It further has a second end having an arcuate edge in engagement with the metallic trace. The arcuate edge enables rolling across the metallic trace when the first end of the contact is engaged by the lead of the DUT and made to rotate about an axis generally perpendicular to a plane defined by the contact. The contact is elastomerically mounted as part of the test set intermediate the load board and the DUT. Rotation of the contact about the axis when the first end of the contact is engaged by the lead of the DUT is thereby facilitated.

A test set employing the contact can utilize multiple contact points which take the form of a plurality of ridges. In one embodiment, the ridges are generally parallel to one another. Similarly, the ridges can be substantially parallel to the axis which is generally perpendicular to the plane defined by the contact.

By so structuring the contact, the contact will have ridges which are sequentially engageable by the lead of the DUT as the contact rotates about the axis from a first orientation, wherein the first end of the contact is initially engaged by the lead of the DUT, to a second orientation, wherein the contact is in a configuration for operational testing.

An inward-most ridge with respect to the test set is the only ridge which is engaged by the lead of the DUT when the contact is in its first orientation. Successively outward ridges are sequentially engaged as the contact is made to rotate about the axis from the first orientation to the second orientation.

The present invention is thus an improved test set structure and contact for use in such a test set. More specific features and advantages obtained in view of those features will become apparent with reference to the DETAILED DESCRIPTION OF THE INVENTION, appended claims and accompanying drawing figures.

BRIEF DESCRIPTION OF THE DRAWINGS

FIG. 6 is a perspective view of a test pin according to the improvement.

FIG. 7 is a perspective view of the pin in FIG. 6 from the other side.

FIG. 8 is a close up perspective view of a test pin tip in FIG. 6.

FIG. 9 is a top plan view of the tip in FIG. 8.

FIG. 11 is a front elevational view of a further alternative embodiment for the tip in FIG. 9.

FIG. 12 is a front elevational view of an alternative embodiment for the tip in FIG. 9.

DETAILED DESCRIPTION

Figure 1:
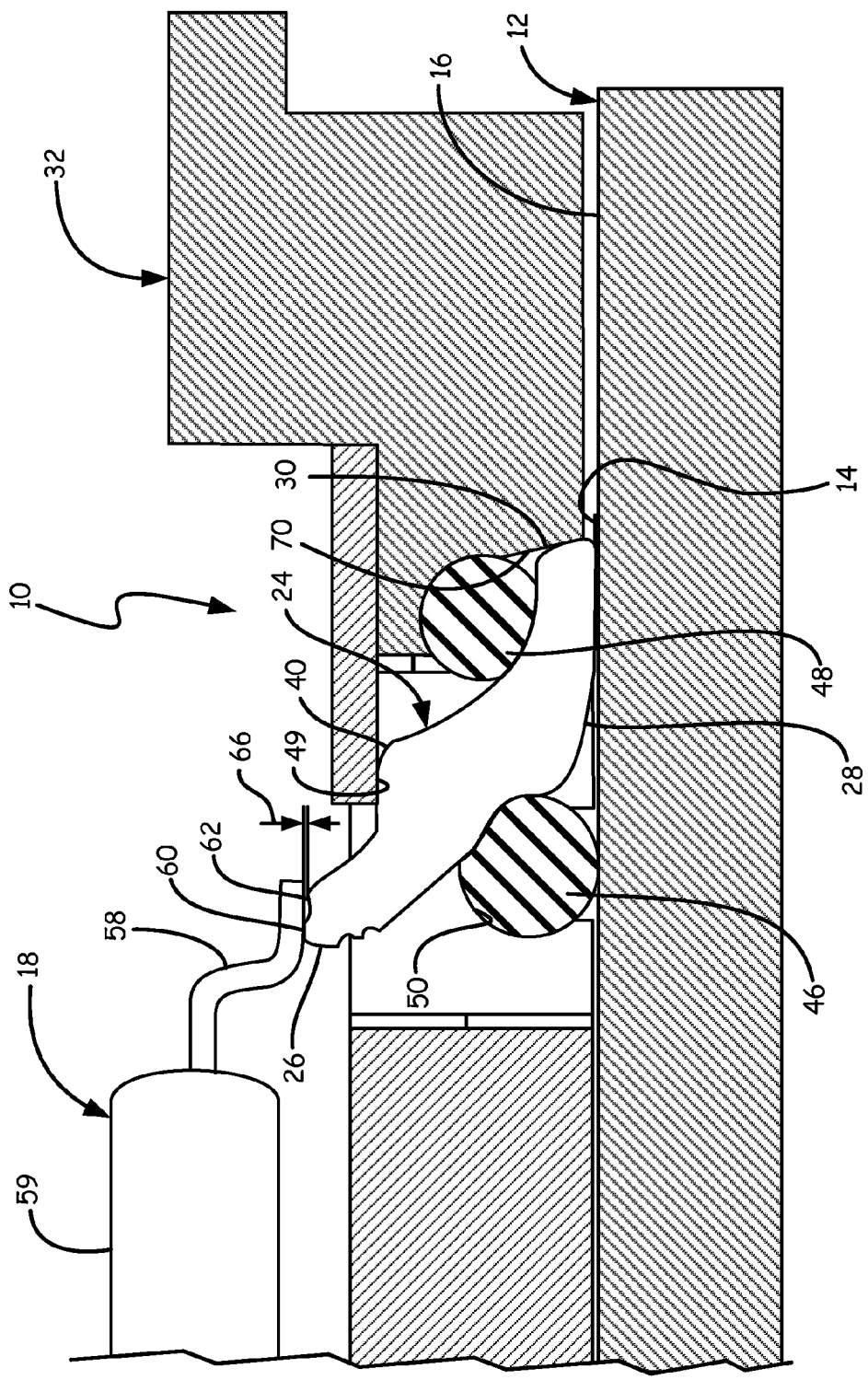
FIG. 1 is a side elevational view of a prior art test set employing a prior art contact some portions being shown in section.
Figure 2:
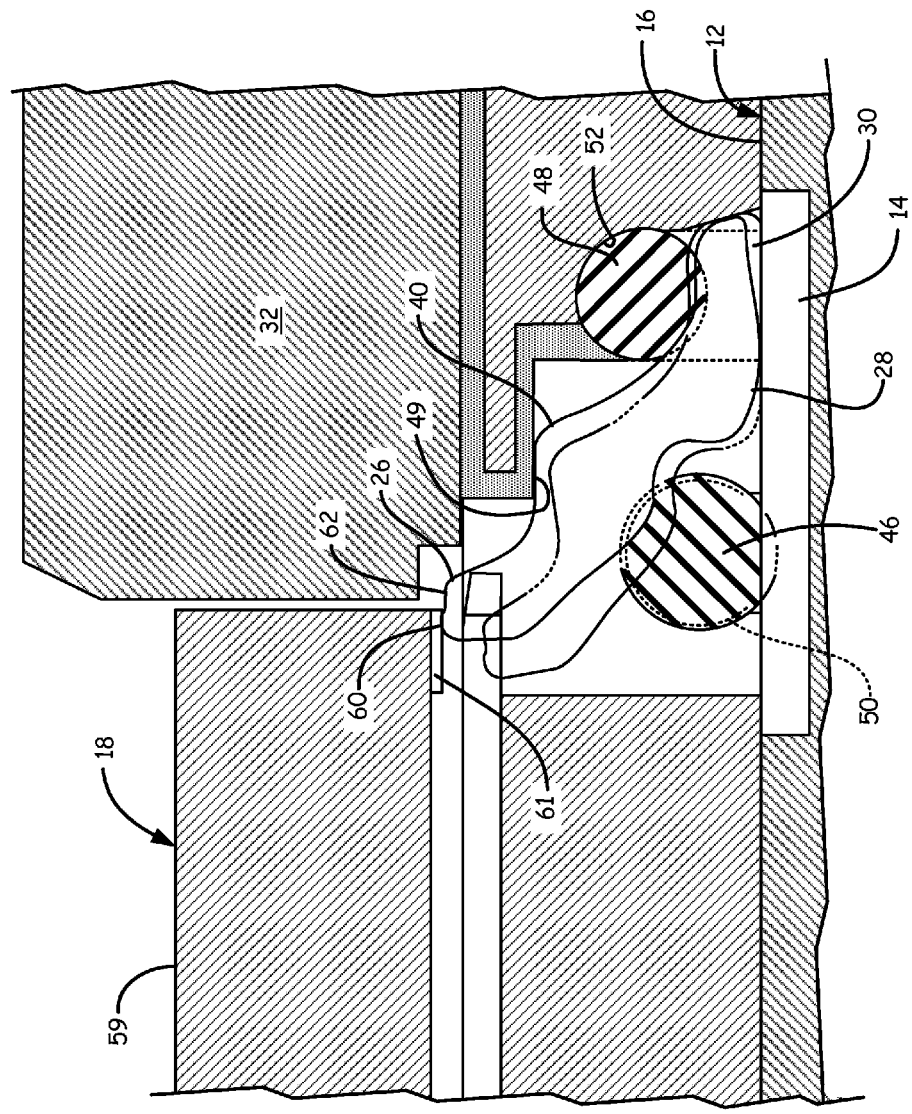
FIG. 2 is a prior art contact similar to FIG. 1 illustrating first and second orientations of the contact.
Figure 3:
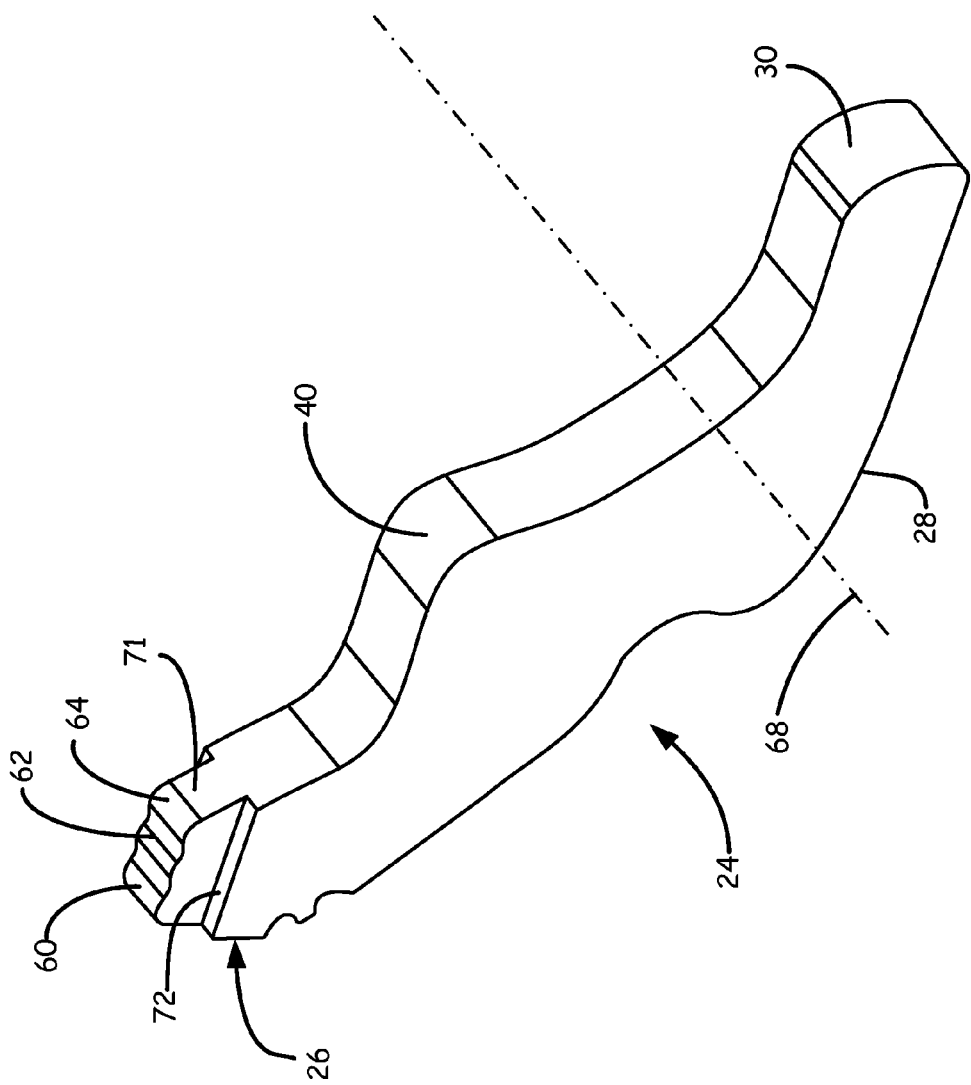
FIG. 3 is a prior art contact in perspective view of a contact.
Figure 4:
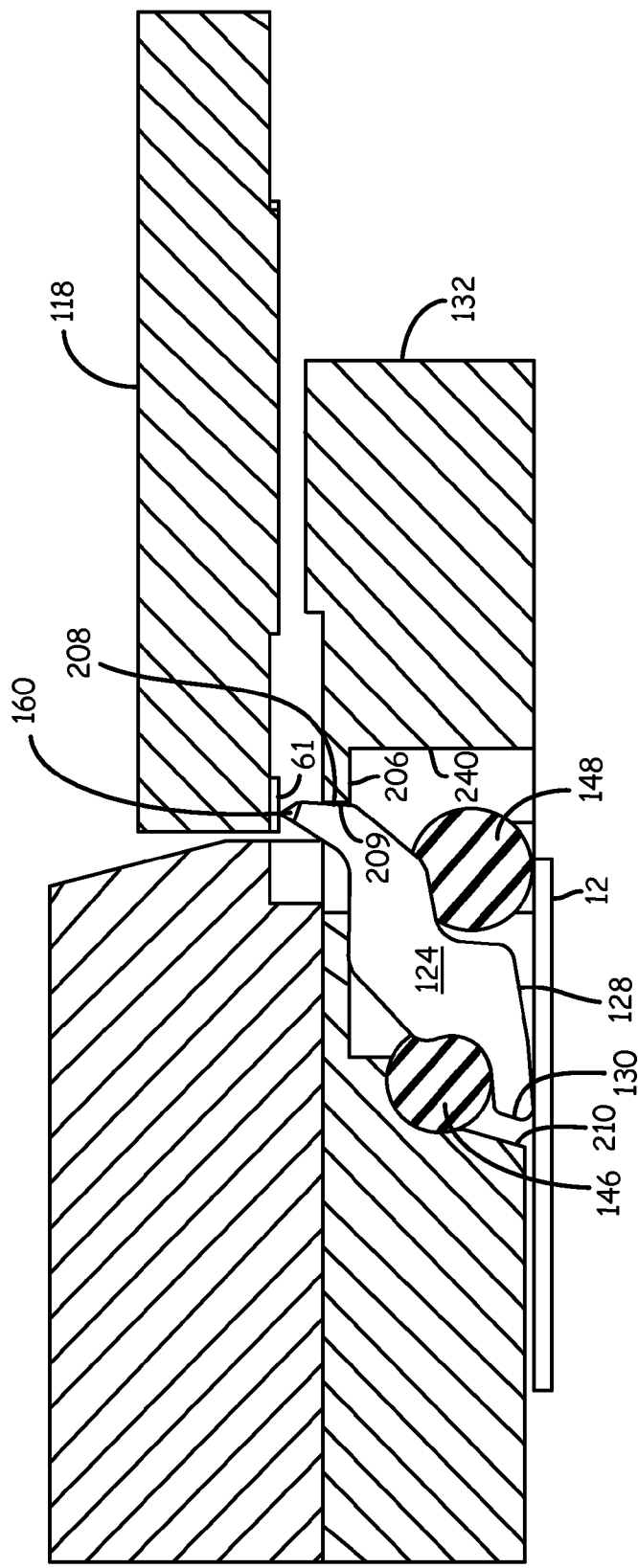
FIG. 4 is a side elevation view of an improved test set.

FIGS. 1-3 refer to prior art exactly as disclosed in U.S. Pat. No. 7,639,026. A full explanation of this art is provided to fully understand the improvements thereover.

Referring now to the drawing figures, wherein like reference numerals denote like elements throughout the several views, FIG. 1 illustrates a test socket 10 in accordance with this figure. The test socket 10 is intended for use with a tester typically employed for ascertaining quality of integrated circuit devices used in electronic appliances. The tester interfaces with a tester load board 12 which has electrically conductive traces 14 formed on a surface 16 thereof to enable electronic communication between the tester and an integrated circuit device 18 to be tested. That is, electrical signals are transmitted between the device under test 18 and the test apparatus through the test socket 10.

It will be understood that various types of integrated circuit devices 18 are able to be tested utilizing a test socket or test set in FIG. 1 illustrates a leaded device having externally-extending leads 58 diverging from the body 59 of the device 18. It will be understood, however, that leadless devices, as illustrated in FIG. 2, can be accommodated. Such devices have pads 61 rather than leads 58.

While it is to be understood that FIG. 1 illustrates a device under test (DUT) package in an elevational view showing a single lead, a plurality of leads 58 are typically part of the device 18. In such cases, a contact 24, as will be discussed hereinafter, will be provided for engagement by each lead 58. It will be understood that substantially identical leads extend, in the case of the type of device 18 illustrated, along both of opposite sides of the device package 18.

In operation, downward pressure is brought to bear upon the body 59 of the device 18 by a plunger mechanism (not shown). As the plunger depresses the device 18 downward, contacts 24, which are mounted in an elastomeric fashion as will be discussed hereinafter, are caused to be rotated with respect to an axis which extends generally perpendicular to a plane defined by the contact 24. An axis with respect to which contact 24 might rotate is identified by reference numeral 68 in FIG. 3.

FIG. 1 illustrates a location of the device 18 and an orientation of contact 24 when lead 58 has first engaged the front, or inner, end 26 of contact 24. FIG. 2 illustrates an orientation of contact 24 (a second orientation) when the device is in a test position. It will be understood that, in view of the construction of contact 24 as will be discussed hereinafter, an arcuate surface 28 at the rear end 30 of contact 24 will roll across trace 14 on the load board 12 with virtually no translational or rotational sliding of that surface along the trace 14. FIGS. 1 and 2 illustrate a wall 70 against which rear end 30 of contact 24 abuts. Such a wall 70 is defined in the housing of the test socket 10. It will be noted that the wall 70 is at a rather large acute angle with respect to the surface 16 of load board 12. Typically the angle is somewhere within a range of between 72.degree.-78.degree. The wall 70 serves to be engaged by rear end 30 of contact 24 in order to preclude sliding of edge 28 along trace 14.

The contact 24 illustrated in the drawing figures includes a protrusion 40. Protrusion 40 functions to engage, when mounted by elastomers 46-48, a shoulder 49 defined by the housing 32. Engagement of the shoulder 49 by protrusion 40 serves to limit the degree of upward movement of the contact 24 and the distance the front end 26 of the contact 24 will extend beyond an upper surface of the housing 32 when the contact 24 is not engaged by a device to be tested.

As previously discussed, elastomers 46, 48 affect mounting of contact 24. The test socket housing 32 is, therefore, provided with a pair of channels 50, 52 which extend along axes generally transverse to a plane defined by contact 24 when it is mounted in the housing 32. Elastomers 46, 48 are received within channels 50, 52 respectively. Rear elastomer 48 is pre-loaded and, as a result of the arcuate surface 28 at the rear end 30 of contact 24 being in engagement with the load board 12, will engage an upper edge of the rear end 30 of contact 24 at a location to urge the front end 26 of contact 24 upwardly. Similarly, front elastomer 46 is under compression and also serves to urge contact 24 upward. Contact 24 will, in its neutral orientation, be positioned and oriented as seen in FIG. 1. This is a first orientation of contact 24 and the one it occupies prior to a device 18 being brought into engagement with the upper end 26 of contact 24 by device 18.

FIG. 1 illustrates multiple contact points defined by upper end 26 of contact 24. The contact points are, as best seen in FIG. 3, generally parallel extending ridges 60, 62, 64. While FIG. 3 illustrates three parallel ridges extending generally parallel to the axis 68, a smaller contact, as shown in FIGS. 1 and 2, might well be provided with only two ridges 60, 62.

FIG. 1 illustrates the locations of ridges 60, 62 relative to each other at the time of first engagement by lead 58 of device 18. It will be noted that ridge 60 is engaged by lead 58, and ridge 62 is not. The spacing between lead 58 and ridge 62, when the contact 24 is in this orientation, is illustrated by reference numeral 66.

As pressure continues to be applied to device 18, contact 24 will be caused to rotate generally counterclockwise about axis 68. At some point, lead 58 will engage ridge 62, and ridge 60 will be rotated downwardly away from lead 58. In the case of a three-ridge embodiment, second ridge 62 will also be withdrawn from lead 58 as third ridge 64 engages the lead.

It has been found that such a multiple contact point contact 24 is particularly effective in dealing with matte tin typically provided on lead 58 to facilitate soldering to an ultimate host board. The multiple ridge construction serves to help control a buildup of tin on front end 26 of contact 24. The first ridge 60 has a tendency to collect the most tin. A non-desirable buildup is deterred by providing multiple ridges. The first ridge serves a sacrificial function in absorbing the greatest transfer of tin.

FIG. 3 illustrates a contact 24 having a narrowed front end 26. Such an embodiment defines a smaller land 71 with spaced shoulders 72 on either side thereof. Such a feature, it is envisioned, would be used when the device being tested were leadless and had a pad generally flush with the bottom of the body of the device 18. Such a land embodiment could even serve to function in an environment wherein the pad or pads of the DUT are recessed within the body of the integrated circuit.

To improve on the structures disclosed above, FIGS. 4-12 are provided. Several improvements are disclosed herein.

It has been determined that oxide and debris can build up on pads 61. In order to break through this oxide, the structures in FIGS. 4-12 are provided. In summary, by making the tip sharp, such as a chisel point or chisel line where two sidewalls converge, the tip may pierce any oxide on the pad and rock instead of scrape along the contact pad.

Further in order to decrease wear on the load board 12, and prevent the tail of the pin from striking the housing adjacent the tail as its "hard stop" point, the tail has been shortened to that such a collision will not occur. Optionally, the hard stop may be moved to adjacent the tip, where the movement of the tip is limited by the engagement of the pin, below the tip, with a longitudinal projection of the housing body.

For purposes of simplifying disclosure, it should be assumed that elements of the disclosure in FIGS. 1-3 are the same or have corresponding elements in FIGS. 4-11 and may have the same number. The number may also be increased by 100 to illustrate a corresponding element. In the embodiment in FIGS. 4-11, pin 124 is maintained within the housing 132 in the same manner as pin 24 in housing 32. Bias elements 146 and 148 provide resilient force as explained above.

Movement of the pin is however deliberately inhibited in one or more ways not found in the prior embodiment to achieve a beneficial effect. Pin 124 includes a tip 160 which will be discussed in further detail below.

Figure 5:
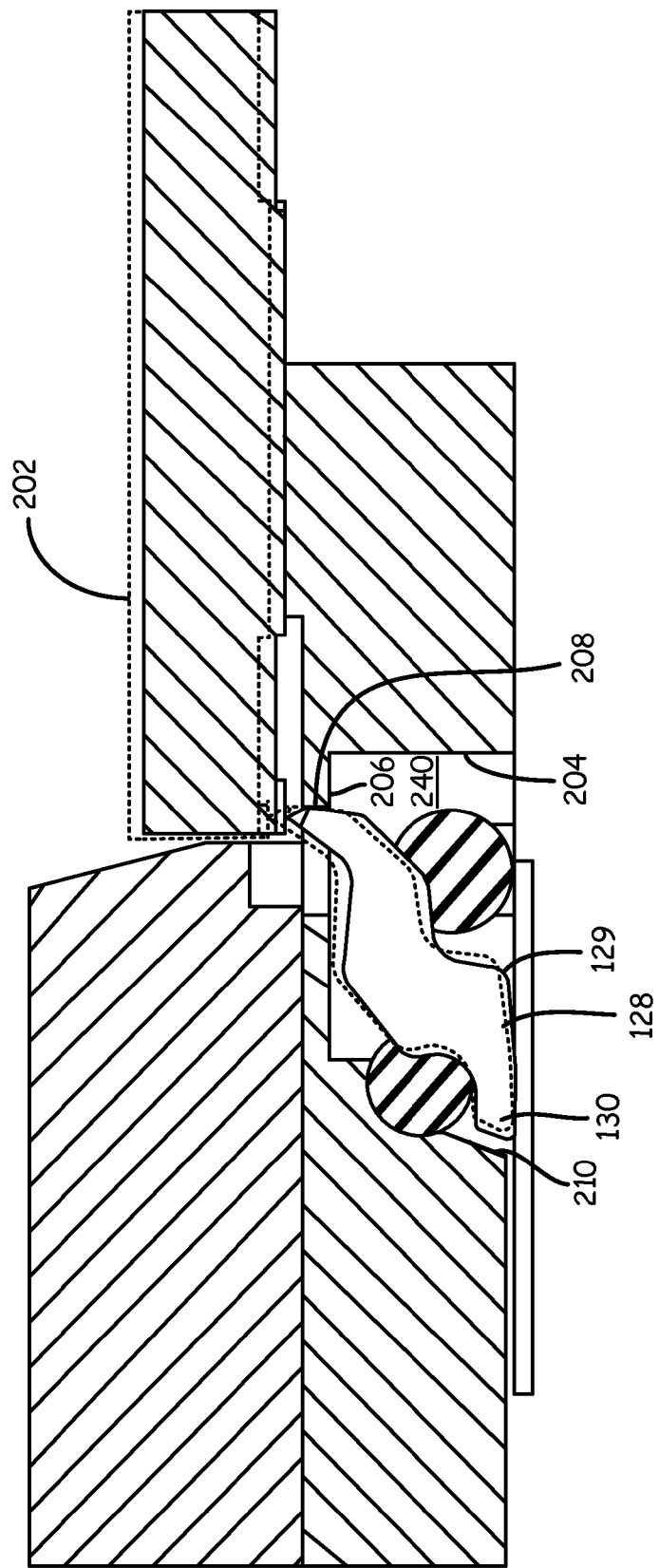
FIG. 5 is a view like FIG. 4 but showing in dotted lines the test set prior to full engagement of the Device Under Test (DUT).

FIG. 5 illustrates the movement of pin 124 in response to insertion of the DUT 118 into the housing 132. The dotted lines 202 indicate pre-insertion position When the DUT is pressed into the housing, pin 124 is moved to the position in solid lines. Note that there is a gap between tail 130, wall 210 in the preferred embodiment which limits wear on the load board because the pin is less likely to slide therealong. Housing 132 includes a vertical wall portion 204 and a lateral extension 206 which terminates in a distal edge 208. This distal edge provides a hard stop for pin 124 at its contact surface 209, when the DUT is in test position. The tail 130 (rear end) of contact 124 is thus prevented from contacting the stop edge 210 of the housing, unlike in the previous embodiment where that stop edge was used as the hard stop. So the distal edge of the tail 130 is not in contact with the housing when the DUT is in test position. This prevents the pin from being forced to slide along the load board as in previous embodiments.

To further reduce load board wear, the base or foot/bottom of the pin has been altered over what was shown in the previous embodiment. The prior shape was arcuate. The preferred alternative shape has less curvature and is nearly flat or has a shallow curvature being slightly arcuate. The foot may also be flat, or have curvature at only the ends of the foot, with a substantially flat portion therebetween, or have a slight curvature from end to end.

In the preferred embodiment the foot 128 is in contact with the load board toward its distal end 130 through the majority of its stroke, i.e. movement from DUT in and out. Furthermore, during this stroke, because the curvature is shallow convex or even flat, more of the foot is in constant contact with the load board than in prior embodiments. This reduces friction.

Figure 10:
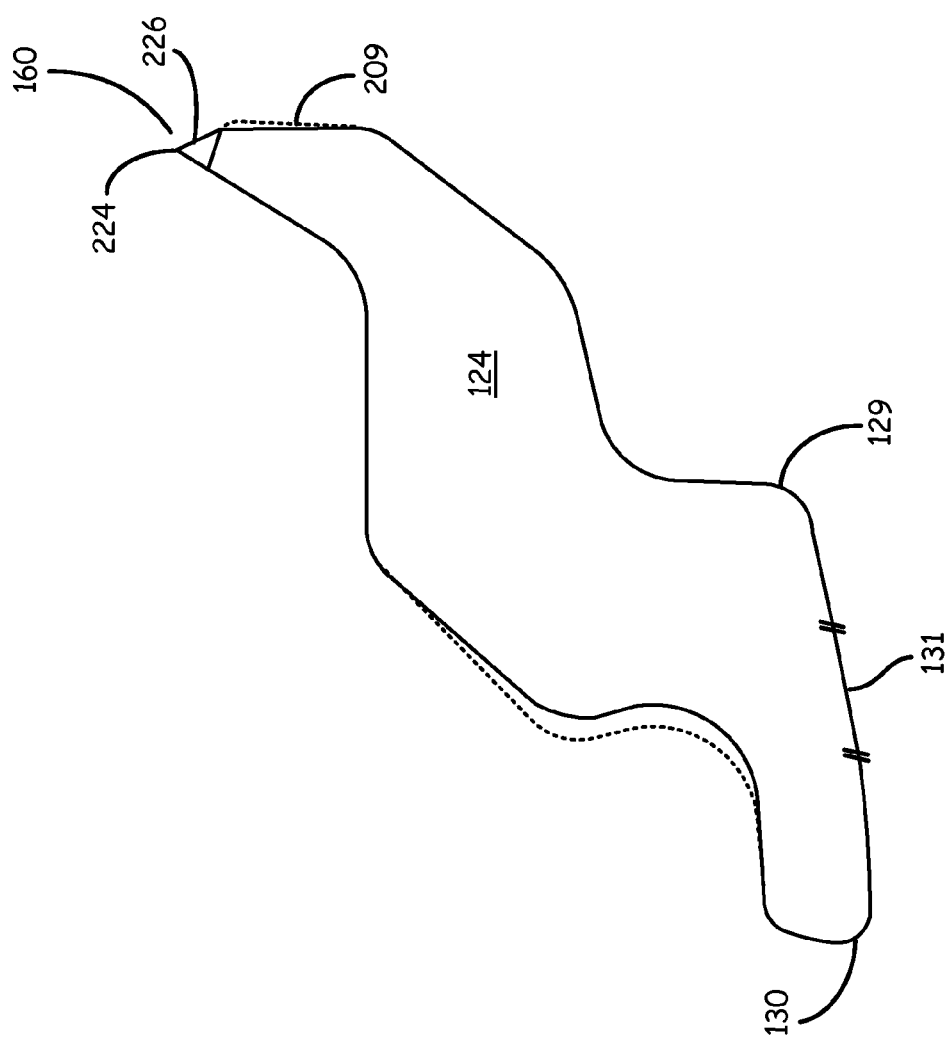
FIG. 10 is a side elevational view of an alternative embodiment for the tip in FIG. 9 also shown in dotted lines to indicate rotational movement.

Another embodiment as shown in FIG. 10 has curved distal end 130, and curved proximal end 129 of foot 128, but a portion 131 of the base between the ends is flat. The flat portion may be distant from said ends, or be proximate thereto, with the remainder of the foot being curved or arcuate, as shown.

Also because the movement of the foot during the stroke is increasing rather than changing the point of contact, there is less lateral movement of the pin on the load board, and it is this movement or slippage which causes load board wear. Since load boards are far more expensive than pins, this is a significant improvement.

Pin 124 is shown in greater details in FIGS. 6-12. Unlike prior embodiments, the preferred structure is capable of piercing the oxide layers on the DUT contact by virtue of a sharp or chisel tip 160.

Further, the piercing action makes a solid point connection with the contact which results in a "rocking" action rather than a sliding action, which increases tip pressure and creates ever better contact with less damage to the tip.

The top includes land 171, narrower than the pin width with spaced shoulders 172 on either side thereof. Such a feature, it is envisioned, would be used when the device being tested were leadless and had a pad generally flush with the bottom of the body of the device 18. Such a land embodiment could even serve to function in an environment wherein the pad or pads of the DUT are recessed within the body of the integrated circuit.

Tip 160 is shown as having a portion 220 extending from the upper surface 222 of the pin. The apex 224 has a chisel line edge across its face. The distal face 226 of the tip preferably has a more gradual slope than face 220 and leads to the contact surface 209 which engages housing wall 208. Wall 208 may also be an edge. It is a lateral extension from the housing into free space 240 in which pin 124 is normally free to move, but whose rotational movement is inhibited by wall 208.

Alternative tip 360, 460 embodiments are shown in FIGS. 11 and 12. In FIG. 12 tip 360 includes a pair of tips 360a, 360b spaced apart by a gap 362. Each of these tips may be shaped just as tip 160 but with a gap between them.

FIG. 11 is similar with a pair of tips 460a, 460b and a gap 462. The tips shown in this embodiment include the addition of sloping sidewalls 466 thereby creating a diamond cut (sloping walls on all 4 sides to an apex which may be a line or a point).

An advantage of the gap is that debris which may collect in the trough between tips.

Operation of the pins in the housing is as described for previous embodiments. The pin rotates on an axis as it moves from DUT removed to inserted. Bias materials are provided, such as elastomers 146, 148 to bias the pin upwardly.

Unlike prior embodiments, tip 160, 360, 460 engage the DUT contact pad along a point or line and tend to stay in a fixed position on the contact pad without sliding, but instead pierce oxide layers to engage metal. Likewise the engagement of walls 209 on the pin and 208 on the housing provide a hard stop against movement of the pin before the tail of the pin 130 can encounter the housing wall 210. This prevents slippage of the pin bottom 128 on the load board. Instead, bottom 128 rocks on the load board. Bottom 128 preferably has a flat section at the point of DUT insertion so that a larger amount of electrical contact surfaces exists between the bottom and the load board.

It will be understood that this disclosure, in many respects, is only illustrative. Changes may be made in details, particularly in matters of shape, size, material, and arrangement of parts without exceeding the scope of the invention. Accordingly, the scope of the invention is as defined in the language of the appended claims.

What is claimed is:

1. A test set including a test pin for use in a test housing, which connects a load board to at least one contact lead of a device to under test (DUT) with a corresponding metallic trace on the load board, when the DUT is in test position, comprising:

a plurality of test pins mounted pivotally with respect to an axis which extends generally perpendicular to a plane defined by the contact lead, each test pin having a first tip end defining a contact point, said contact point configured to engage a contact lead of the DUT, said test pin having a bottom having an edge in engagement with the metallic trace said test pin including a vertically oriented planar hard stop edge, and said housing including an aperture permitting said tip to protrude there through, said aperture including a generally vertically planar wall including a hard stop wall, said tip protruding through said aperture, said hard stop wall located to engage said hard stop edge in planar to planar contact when the DUT moves from an in-test to out of test position;

at least one elastomeric bias element engaging said pin and biasing said stop edge toward said hard stop wall;

wherein said hard stop wall is located such that when said hard stop edge is engaged therewith, thereby substantially limiting the lateral movement of said tip and directing said tip into a substantially up and down movement.

2. A test set in accordance with claim 1, wherein said tip includes a chisel shape and a pair of converging walls meeting at a chisel line, said chisel line being the distal-most element on said pin, thereby positioned to engage said DUT contact.

3. A test set in accordance with claim 1, wherein the hard stop edge is canted away from a vertical axis.

4. A test set in accordance with claim 1, wherein the hard stop edge deviates from a vertical axis.

5. A test set in accordance with claim 1, wherein the pin includes a bottom edge adjacent the load board and wherein a portion of the bottom edge is substantially flat in that region which is in contact with the load board when the DUT is in test position.

6. A test set in accordance with claim 1, wherein said hard stop edge is adjacent said tip.

7. A test set in accordance with claim 1, wherein said hard stop wall includes a portion of the housing projecting laterally therefrom to create an overhang over free space.

8. The test set of claim 1, wherein bottom edge is substantially flat where said bottom edge contacts said load board when said DUT is in test position, after said pin has rotated on said axis.

9. The test set in accordance with claim 1, wherein said tip includes a chisel shape.

10. The test set of claim 9, wherein said chisel shaped tips each including an apex and having four sloping sidewalls extending away from the apex.

11. The test set of claim 9, wherein said chisel shaped tips each including an apex and having two vertical parallel sidewalls and two sloping sidewalls extending away from the apex.

12. A method of making a chip test fixture which limits lateral movement of a test pin tip during chip test, having a load board, a housing, a plurality of test pins vertically confined within the housing and a receiver for a device under test (DUT) having contact leads, the test pins having a tip and an adjacent stop edge, the housing having a stop wall adjacent said stop edge on the housing, comprising the steps of:
   a. mounting the test pins to rotate around an axis,
   b. biasing the test pins upwardly toward the receiver for the DUT
   c. forming the test pins with a chisel shaped tip to contact said contacts leads limiting the rotational movement of said test pins tips by positioning the stop edge adjacent the stop wall and forming said wall and edge as mating planar surfaces, such that said planar stop edge and planar stop wall are in plane to plane contact at all times during use by biasing the test pins such that said stop edge against said stop wall so that when the DUT is inserted into the receiver, the pin will sharply engage the contacts leads and its lateral movement cross the contact leads will be constrained by the plane to plane contact.

13. The method of claim 12, wherein said test pins further include a tail portion distant from said tip, and further including the step of limiting the movement of said test pins in response to said DUT, so that the tail portion does not engage the housing when the DUT is in the receiver.

14. The method of claim 12, wherein said planar surface of said stop edge is canted from a vertical axis.

15. The method of claim 14, wherein said flat section is formed between ends of the bottom portion and generally where said bottom will contact said load board when said DUT is in the receiver.

\* \* \* \* \*